United States Patent [19]

Chiang

[11] 4,343,877
[45] Aug. 10, 1982

[54] SYSTEM FOR DESIGN AND PRODUCTION OF INTEGRATED CIRCUIT PHOTOMASKS AND INTEGRATED CIRCUIT DEVICES

[75] Inventor: Ping-Wang Chiang, Los Gatos, Calif.

[73] Assignee: Amdahl Corporation, Santa Clara, Calif.

[21] Appl. No.: 222,253

[22] Filed: Jan. 2, 1981

[51] Int. Cl.³ .............................................. G03C 5/00
[52] U.S. Cl. .......................................... 430/5; 430/22; 430/311; 430/312; 430/394; 430/396; 357/85
[58] Field of Search ...................... 430/22.5, 394, 396, 430/311–319; 356/401; 357/85

[56] References Cited

U.S. PATENT DOCUMENTS 3,697,318 10/1972 Feinberg et al. ..................... 430/314
3,968,478 7/1976 Mensch ................................. 357/41

OTHER PUBLICATIONS

IBM Technical Disclosure Bulletin, vol. 14, No. 4, Sep. 1971, "Wafer Identification", pp. 1030, 1031.

Primary Examiner—Mary F. Downey
Attorney, Agent, or Firm—Flehr, Hohbach, Test, Albritton & Herbert

[57] ABSTRACT

System for design and production of integrated circuit photomasks and integrated circuit devices wherein the four adjacent corners of each circuit topography pattern on each photomask and each wafer chip area are set aside as designated information locations. One of the designated information locations containing a two-dimensional rectangular array of locations for use as a mask sequence array and a second of the designated information locations containing a two-dimensional rectangular array of locations for use as an alignment key pattern array. The third designated information location serves as a product identification area which may include a manufacturer name and a product identification code. The fourth designated information location is adapted to serve as a test device area and may also serve as a part identification area in semiconductor processes employing a two layer metal interconnect system.

19 Claims, 10 Drawing Figures

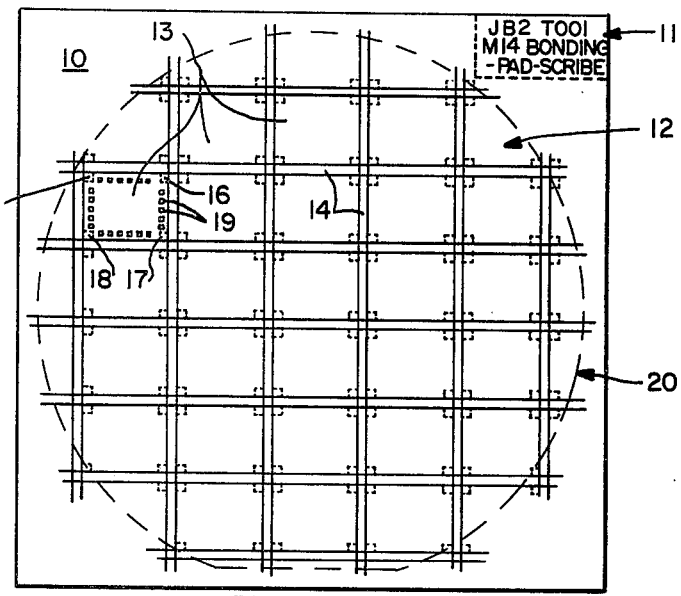
FIG.—1
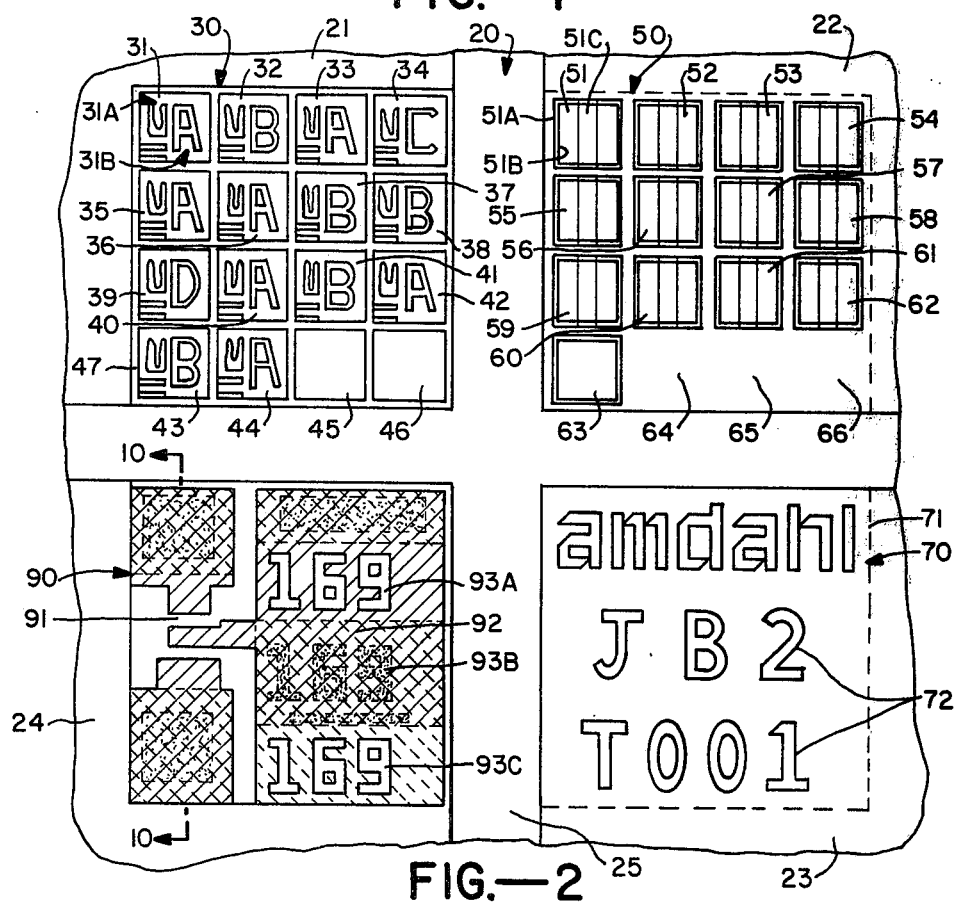
FIG.—2

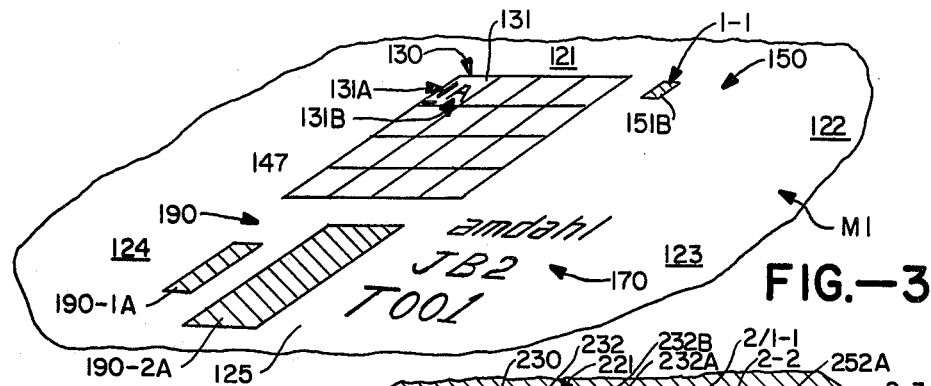
FIG.-3
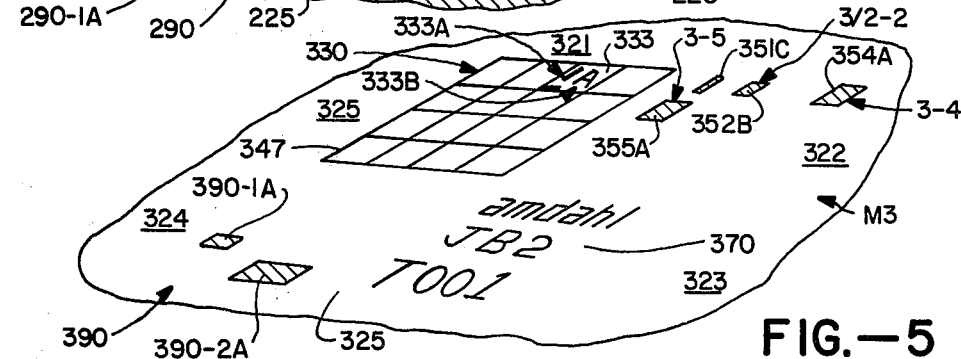
FIG.-4
FIG.-5
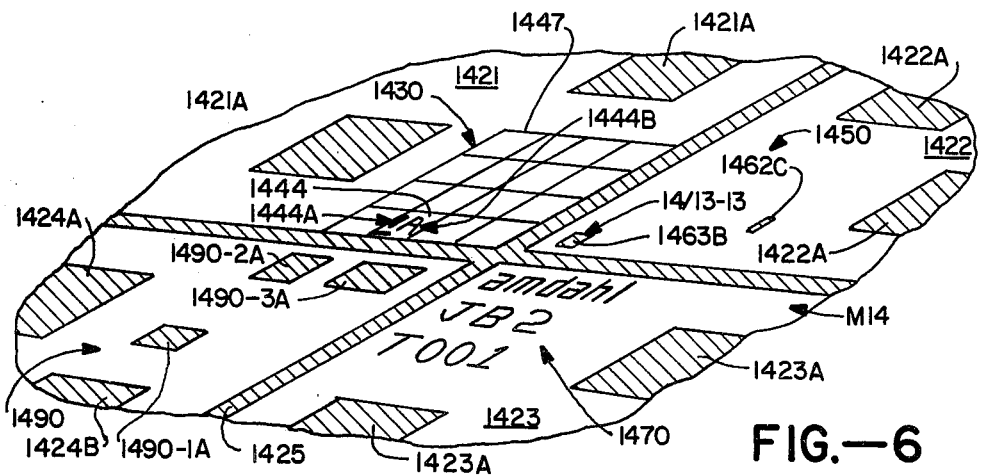
FIG.-6

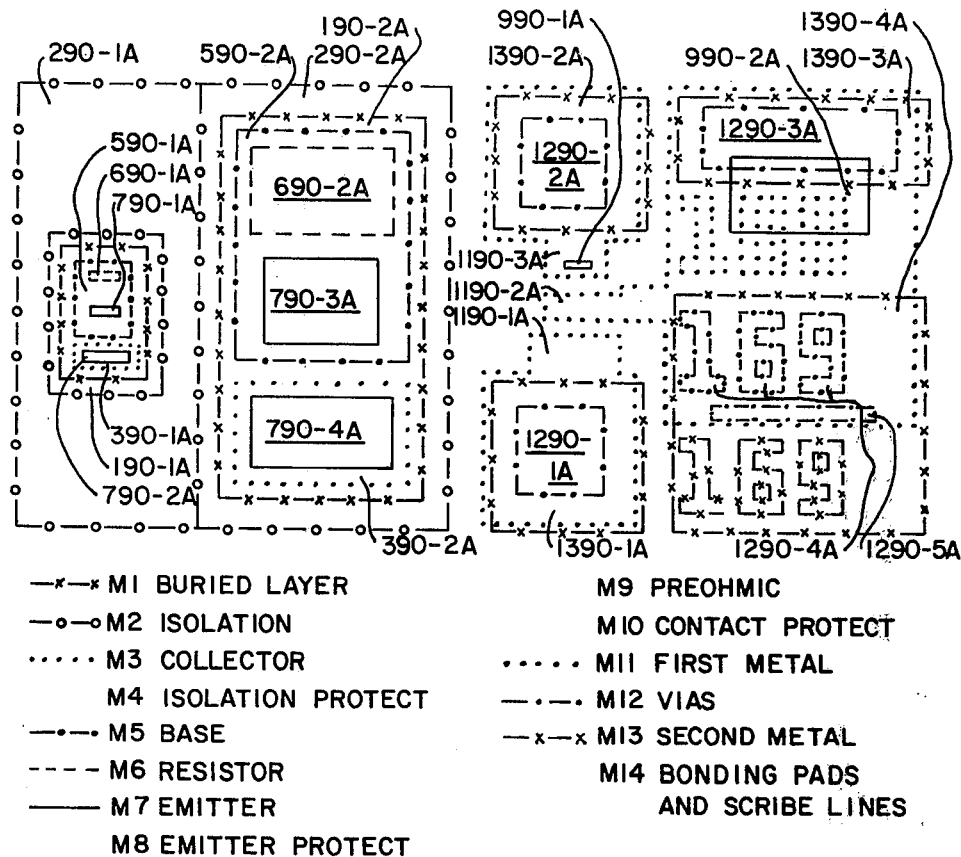
| | |
|---|---|
| —×—× M1 BURIED LAYER | M9 PREOHMIC |
| —o—o M2 ISOLATION | M10 CONTACT PROTECT |
| ····· M3 COLLECTOR | ····· M11 FIRST METAL |
| M4 ISOLATION PROTECT | —·—· M12 VIAS |
| —·—· M5 BASE | —×—× M13 SECOND METAL |
| ---- M6 RESISTOR | M14 BONDING PADS AND SCRIBE LINES |
| ——— M7 EMITTER | |
| M8 EMITTER PROTECT | |
FIG.—7    FIG.—8
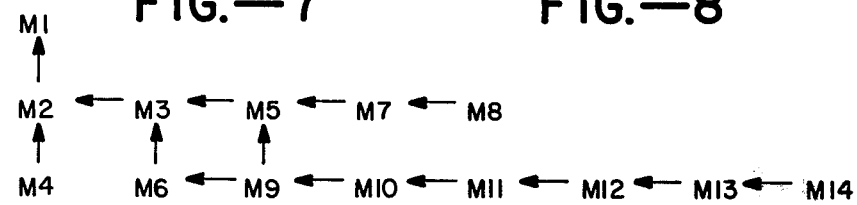
FIG.—9
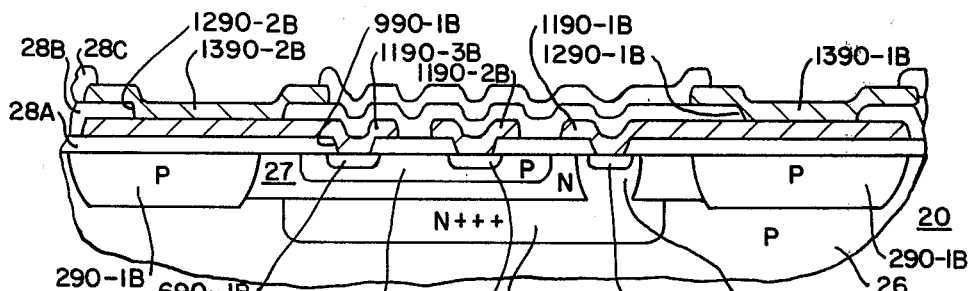
FIG.—10

SYSTEM FOR DESIGN AND PRODUCTION OF INTEGRATED CIRCUIT PHOTOMASKS AND INTEGRATED CIRCUIT DEVICES

This invention relates generally to semiconductor integrated circuit manufacturing technology and, more specifically, to a system for designing and producing integrated circuit photomasks and integrated circuit devices.

Semiconductor processing technology for transforming a semiconductor wafer into a plurality of integrated circuit (IC) chips involves a complex sequence of process steps which must be accurately performed to produce a high yield of working chips among the large number of candidate dice on each processed wafer. Most semiconductor fabrication facilities are multiprocess, multidevice facilities, i.e., the facilities are implementing more than one semiconductor process and each of the semiconductor processes is utilized to produce a plurality of different IC devices. Generally certain areas of a semiconductor fabrication facility will be devoted to a particular semiconductor process whereas other areas will be timeshared among various processes. Typically the devoted areas of the facility will include diffusion furnace areas and etching stations which will be set up to implement a specific semiconductor process. To keep track of the state of processing of each batch of devices, a process run sheet, commonly called a traveler, is kept with each wafer batch to record the performance of the various steps in the processing sequence. However, since the process steps to be performed by the devoted line or module are always the same for each step in the process, the personnel performing these process steps readily become expert at carrying out the process steps in the proper sequence utilizing the traveler as a guide.

One of the most critical aspects of semiconductor processing technology involves photolithography steps which are utilized to produce patterned masking layers on the wafer, which in turn are utilized to create the topographical and topological structure of diffused regions overlying insulating layers and conducting layers which comprise an integrated circuit. A typical semiconductor process involves a number of sequential photolithography operations, each of which must be performed in its proper sequence and with good process control in order to produce a high yield of good IC chips. Each device being manufactured by a particular semiconductor process will have associated with it a set of photomasks which must be utilized in proper sequence and in correct alignment or else a defective batch of wafers may result.

One of the most critical aspects of photolithography is the selection of the right photomask to utilize at that stage of the process, and the appropriate alignment of that photomask to the topography pattern, if any, already produced on the wafer. This aspect of the photolithography operation is typically carried out in a time-shared portion of a multiprocess, multidevice facility. The photomask alignment operator must perform mask-to-wafer alignment using photomasks from a number of different photomask sets associated with different devices and different semiconductor processes. In order to perform a proper photomask alignment step, the operator must first identify the proper mask set for the IC devices being formed on a particular batch of wafers. The operator must then identify and select the photomask from that set which has the correct sequence number for the stage of wafer processing of the particular batch of wafers. Finally, the operator must align the correct photomask to each wafer in turn with correct orientation and position with respect to the topography previously created on the wafer, if any, as a result of prior photolithography operations and related process steps. It is highly preferable that, during the alignment step, the operator be able to verify that the mask which is being aligned is the correct mask sequence number from the correct mask set as a final check on correct mask selection.

It is well-known in the art to provide on each photomask in each photomask set alignment keys which enable the photomask alignment operator to align the photomask to the wafer with correct orientation and position. However, generally the placement of the alignment keys is within the discretion of the mask designer. Thus, the mask alignment operator must refer to detailed instructions with each product to locate the alignment key on the photomask and the replicated aligning keys on the wafer since generally they will be in different places on different devices.

It is also well known in the art to provide a mask sequence number on each topography pattern on the photomask so that the photomask alignment operator can verify selection of a photomask in the proper sequence. However, at most facilities, the placement of the mask sequence number within each topography pattern on the photomask is within the discretion of the photomask designer so the operator must either search for the mask sequence identification or refer to instructions as to where it is located.

It is also known in the art to place a device identification code on each topography pattern on a particular photomask to enable verification of the selection of a photomask from the proper mask set. However, in most facilities, the placement of this device code is also at the discretion of the mask designer. Consequently, the photomask alignment operator must either search for the product identification code or refer to instructions as to its location. As a second level of complexity, in some instances where a particular device is part of a master/slice system in which the actual device configuration is determined by the patterning of the metal interconnect layers, a device will not only have a device number but a part number associated with it. In most instances the part number is not identified on the metal and via mask so proper selection of the correct via and metal masks for that part number cannot be verified by the operator while performing the alignment operation on those masks.

Because of the time required for the photomask alignment operator to locate the device number and mask sequence identification information on photomasks due to the arbitrary location of such information, and because the alignment aspect of the operation is the most critical aspect of mask alignment, in many instances the operator will not take time to verify appropriate mask selection in the process of performing the mask-to-wafer alignment but will simply assume that the correct mask from the correct mask set has been obtained. Since the operator typically already had to refer to detailed alignment instructions to enable identification of the alignment key on the photomask and the aligning key on the wafer among many possibilities, to expedite the alignment operation other time consuming inspections of other information on the photomask will often be eliminated in order to achieve higher throughput at the mask alignment stage of the process. This sometimes results in mistaken use of the wrong photomask and can result in the production of defective wafers. Moreover, even with reference to detailed alignment instructions, sometimes it is difficult for the operator to detect the correct orientation of the mask with respect to the wafer during the use of alignment keys to align the mask to the wafer since there is generally nothing in the alignment key area on the photomask to enable verification of correct photomask to wafer orientation alignment with incorrect orientation will produce defective wafers.

Another important aspect of photolithography operations is quality control monitoring of the operation to verify proper mask sequence use and to monitor the accuracy of photolithography using a critical dimension pattern replicated on the wafer during the photolithography operation. With arbitrary or discretionary placement of mask sequence information and critical dimension pattern information on topography patterns on photomasks, quality control monitoring is more difficult and time consuming since the wafer must be searched for required information. As a result, sometimes certain desirable quality control steps such as measuring critical dimension patterns and verifying proper mask sequences tend to be neglected because of the time required to find the location of required information on the multiple topography patterns produced on the wafer. Neglect of these monitoring functions may result in loss of process control and decreased process yields.

From the above discussion it should be apparent that the prior art approach to providing important device identification, mask sequence and alignment key information on photomasks contributes to substantial inefficiency and yield falloff in photolithography operations in semiconductor processing.

It is a general object of this invention to provide an improved system for producing integrated circuit photomasks and integrated circuit devices.

More specifically, it is an object of this invention to provide an improved method for providing mask sequence, mask alignment and device code information on photomasks.

It is a further object of this invention to provide an improved process for the design and manufacture of integrated circuit chips.

It is another object of this invention to provide improved photomasks for use in semiconductor processing.

It is another object of this invention to provide semiconductor wafers having an improved yield of functioning integrated circuit chips.

In accordance with one aspect of this invention the above-identified objects are achieved in a method for providing mask sequence and mask alignment information on a set of photomasks designed to be used in processing semiconductor wafers into integrated circuits wherein the photomasks are to be used in a prearranged sequence during sequential photolithography steps and a topography pattern on each photomask except the first is required to be aligned to the wafer topography pattern created by use of at least one prior photomask in accordance with a predetermined mask alignment formula. The method includes selecting prior to photomask design and generation a plurality of common corner subareas of each circuit topography pattern area on each photomask to be used as designated information locations, one of the designated information locations being adapted to contain a two-dimensional rectangular array of locations for use as a mask sequence array and another of the designated information locations being adapted to contain a two-dimensional rectangular array of locations for use as an alignment key pattern array. The method also includes forming in each of the mask sequence arrays on each photomask a mask sequence indicia positioned in a unique one of the mask sequence array locations. In addition, in the alignment key pattern array on each photomask, an alignment key pattern is provided in the form of one or both of alignment and aligning keys positioned in prearranged ones of the key locations.

In a preferred method another one of the designated information locations is adapted to serve as a product identification area and the method includes the step of forming in the products identification area on each photomask an identical indicia of one or both of the product manufacturer and product identification code. In processes which require the formation of test devices on each chip, the method involves the selection of another of the design information locations to serve as a test device area and further includes the step of forming in the test device area on successive photomasks the topography pattern required for forming the test devices during sequential photolithography steps and related wafer processing operations. When adapted for use with semiconductor processes which employ two-layer metal interconnect systems and which require a part identification in addition to a device identification as part of a master/slice system, the method includes forming in the test device area for each of the photomasks involved in patterning the first and second metal layers and the intervening insulating layer a topography pattern including a part number identification pattern at a preselected different location so that three replicated part number identification patterns will be produced at separate locations on completely processed wafers within the test device areas.

In accordance with another aspect of this invention, the above-stated objects are achieved in a process for the design and manufacture of integrated circuit chips which includes the step of designing each of a plurality of photomasks required to be utilized in sequence for performing photolithography operations in conjunction with a particular semiconductor integrated circuit fabrication process while leaving a plurality of common corner subareas of each circuit topography pattern area one each photomask free of circuit topography and interconnect patterns to be used as designated information locations, one of the designated information locations being adapted to contain a two-dimensional rectangular array of locations for use as a mask sequence array and another of the designated information locations being adapted to contain a two-dimensional rectangular array of locations for use as an alignment key pattern array. The process further includes forming a mask sequence array on each photomask, with a mask sequence indicia positioned in a unique one of the mask sequence array locations. In the alignment key pattern array on each photomask is formed an alignment key pattern in the form of one or both of alignment and aligning keys positioned in prearranged ones of the key locations. Thereafter, a prearranged sequence of processing steps is performed on a semiconductor wafer including a prearranged sequence of photolithography processing steps each using one of the photomasks in sequence and including, for each of the photolithography processing steps after the first, a step of aligning the topography pattern on an associated one of the photomasks to the wafer topography pattern produced as a result of prior photolithography processing steps. The alignment step includes first checking the proper sequencing of photomask use and proper photomask orientation using the preselected indicia location in the mask sequence array together with a replicated indicia produced on the wafer as a result of prior photolithography processing steps and aligning the photomask to the wafer by aligning a preselected alignment key on the photomask to a prearranged aligning key produced on the wafer as a result of prior photolithography processing steps.

Preferably in this process another one of the designated information locations is selected to serve as a product identification area. In this preferred method the process further includes the step of performing in the product identification area on each photomask an identical indicia of the product manufacturer and a product identification code. Furthermore, the alignment step further includes checking the use of a photomask from the appropriate mask set by comparing the product identification code on the mask to the product identification code replicated on the wafer as a result of prior photolithography steps.

In a preferred version of the method the step of forming the mask sequence indicia includes forming a light field mask coding pattern comprising a prearranged marked two-dimensional array of geometric areas together with a preselected indicia (preferably a critical dimension pattern) located in a prearranged one of the geometric areas indicating the particular photomask sequence number associated with each of the photomasks. Furthermore, in this preferred process the alignment key pattern area comprises a two-dimensional array of sequential key locations and a preferred system to forming the alignment key pattern is utilized. This preferred approach includes designating for each photomask after the first one an alignment key location which is either the same location as the immediately preceding photomask or the next location in the array of sequential key locations. On the first photomask of the set is formed at the time of photomask generation a mask key pattern comprising aligning keys for all associated ones of the photomasks designed to be aligned to the topography pattern created by use of the first photomask with each of the aligning keys being formed at designated alignment key locations for the associated aligned photomasks. On each of the remaining photomasks of the set is formed a mask key pattern comprising an alignment key at the designated alignment key location together with aligning keys from any associated higher number ones of the photomasks designed to be aligned to topography created by use of the photomask, with each of the aligning keys being formed at the designated alignment key locations of the associated aligned photomasks. On each photomask having a mask sequence number greater than two and being the first in the set to have a particular designated alignment key location, a used key pair blot mark is formed at a key location immediately preceding the designated alignment key location for that mask.

In this preferred process the step of aligning the photomask to the existing circuit topography on the wafer comprises the step of aligning the alignment key on the photomask at the designated key location to the aligning key reproduced on the wafer at the designated key location as a result of prior photolithography process steps using an associated lower number photomask and utilizing used key pair blot marks, if any, reproduced on the wafer as a result of prior photolithography process steps together with a used key pair blot mark, if any, formed on the mask as a self-instructing mask alignment guide. With this self-instructing mask alignment guide the step of aligning each of the photomasks having a blot mark thereon is facilitated by aligning key after the blot mark on the mask to the aligning key on the wafer located two key locations after the last blot mark, if any, previously created on the wafer. Furthermore, the step of aligning each photomask having no blot mark thereon is facilitated by aligning the alignment key on the mask to the aligning key on the wafer located one key location after the last blot mark, if any, previously created on the wafer.

In accordance with another aspect of this invention a set of photomasks is provided which is adapted to be used during sequential photolithography processing steps in an overall process for manufacturing integrated circuit chips on a semiconductor wafer. In the photomask set, a plurality of designated information locations are formed in a plurality of common corner subareas of each circuit topography pattern area on each mask in the set. One of the designated information locations is adapted to contain a two-dimensional rectangular array of locations for use as a mask sequence array and another of the designated information locations is adapted to contain a second rectangular array of locations for use as an alignment key pattern array. Each of the photomasks has a mask sequence indicia positioned in a unique one of the mask sequence array locations and has an alignment key pattern formed in the alignment key pattern array in the form of one or both of alignment and aligning keys positioned in prearranged ones of the key locations.

Another aspect of this invention features a semiconductor wafer having formed thereon a plurality of replicated partial or completed integrated circuit structures with each of the integrated circuit structures having a plurality of corner subareas free of functioning circuit structures and circuit interconnect structures. One of the corner subareas has a photomask sequence coding pattern thereat in the form of a two-dimensional rectangular array of preselected indicia (preferably including a critical dimension pattern) positioned in locations of the array corresponding to mask sequence numbers of photomasks used to create the integrated circuit structure. Another of the corner subareas has a two-dimensional rectangular array of used alignment key pairs thereat. The used alignment key pairs are positioned in predetermined key locations in the array corresponding to assigned alignment key locations for the photomasks used to create the integrated circuit structures. The convenient, known locations of the array of mask sequence indicia and array of alignment key pairs enable ready verification of the proper sequence of photomask use during sequential photolithography operations performed on the wafer.

For shorthand reference the system of this invention will be called a mask/chip corner information system. The system for producing integrated circuit photomasks and integrated circuit devices of this invention has numerous advantages over the prior art system. By gathering all of the mask sequence, mask alignment, and device code information into common corner subareas of each circuit topography pattern area on each photomask, all of this information is effectively gathered together into one microscope image field where the four corners of four adjacent circuit topography pattern areas on the photomask come together. This permits the photomask alignment operator to view all of this information in one field of the mask alignment microscope so that no searching for the information is required to verify that the proper mask having the proper sequence number from the proper mask set has been selected to align to the wafer. By proper positioning of the mask with respect to the wafer the operator can see the four corner subareas on the mask and the four corner subareas on the wafer. The device identification code on the mask can be quickly compared with that replicated on the wafer. The operator can verify that the mask sequence indicia in the mask sequence array on the photomask is in the next location vis-a-vis the mask sequence indicia replicated on the wafer in the immediately preceding photolithography operation. After having verified proper mask selection, the operator can quickly locate the alignment key on the mask and perform the mask-to-wafer alignment operation.

The preferred embodiment of this invention has additional advantages in that the mask sequence array is a marked array of sequential locations which can be utilized as a rough alignment guide. Furthermore, the preferred version of the alignment key system not only permits the mask alignment operator to immediately locate the alignment key pattern on the mask, but that alignment key pattern is self-instructing as to the alignment key on the mask and the aligning key on the wafer so that the operator can perform the mask alignment without reference to extrinsic written instructions. This invention provides a further advantage in that, by gathering all of the information together in one image, the photomask alignment operator can readily verify that the initial orientation of the mask to the wafer is correct since the mask sequence indicia array on the photomask will be rotated with respect to that replicated on the wafer if the mask-to-wafer orientation is not correct.

Another advantage of a preferred version of this invention, wherein the mask sequence indicia in the mask sequence array includes a critical dimension pattern, is that the critical dimension pattern may be readily located by quality control personnel to verify both proper mask sequencing and to monitor the accuracy of the photolithography operation.

Overall the system of this invention provides for greater efficiency and substantial reduction in yield falloff at the mask alignment stage and a reduction in yield fallout in photolithography operations in semiconductor processing. This contributes materially to the overall efficiency and yield of integrated circuit production and reduces the manufacturing cost of integrated circuit devices.

Other objects, features, and advantages of this invention will be apparent from the consideration of the following detailed description in conjunction with the accompanying drawings.

FIG. 1 depicts schematically an integrated circuit photomask having an array of multiple topography patterns thereon and incorporating the mask/chip corner information location system of this invention.

FIG. 2 is an enlarged schematic view of a portion of an integrated circuit wafer illustrating use of the mask/chip corner information system of this invention.

FIGS. 3 to 6 are schematic isometric representations of sections of different masks in a mask set illustrating a preferred mask/chip corner information system in accordance with this invention.

FIGS. 7 and 8 are schematic representations of the topography patterns formed on sequential masks in a representative mask set with respect to a test device corner subarea in accordance with this invention.

FIG. 9 is a mask alignment formula for the representative mask set illustrated in FIGS. 7 and 8.

FIG. 10 is a partial simplified section view of a bipolar test transistor taken along the lines 10—10 in FIG. 2.

FIG. 1 depicts schematically a single photomask 10 for a semiconductor process. The photomask 10 includes a mask description area 11 in which the device number associated with the photomask set is typically recorded. The mask sequence number and the name of the mask may also be recorded in this area. Of course this same information may be located in other places on the photomask such as one of the edges. Generally this information will be visible to the naked eye of the mask alignment operator. The remainder of the mask is a circuit topography area 12 which contains a plurality of individual replicated circuit topography patterns 13 each associated with an individual integrated circuit chip. The detailed structure of these circuit topography patterns is only visible under a microscope. Between the individual circuit topography patterns are scribe line areas 14 which are later utilized to dice the wafer into individual integrated circuit chips. The sizes of the individual integrated circuit topography patterns 13 shown in FIG. 1 is substantially larger than the typical circuit pattern size on the actual photomask but the enlarged size is utilized here for purposes of illustration.

One of the circuit topography pattern areas 13 is shown in detail as an example of a pattern which might be seen on an actual photomask. In this case the photomask is a bonding pad and scribe line photomask and each of the individual squares 19 consists of a photomask area which corresponds to bonding pads formed in the last metal layer on the wafer. Generally on an actual photomask, this pattern would not be visible to the naked eye. It has been enlarged for illustration purposes. The photolithography operation performed using this mask involves opening windows to the bonding pads and scribe lines through a passivation or cover layer over the integrated circuit structure on the wafer. With proper photomask-to-wafer alignment, the pattern of squares on each individual circuit topography pattern on the photomask will correspond to the pattern of bonding pads on the wafer and the scribe line pattern on the mask will correspond to the scribe line pattern on the wafer.

As shown each of the individual circuit topography pattern areas 13 has four corner subareas 15, 16, 17, and 18 which, in accordance with this invention are selected as designated information locations to remain free of circuit topography and interconnect patterns. The dashed line 20 represents the outline of a semiconductor wafer. As can be seen the bottom portion of the wafer has a straight edge region which is normally called the major flat of the semiconductor wafer. This straight edge or major flat is utilized for basic orientation of the wafer and is generally considered the bottom of the wafer. The array of individual circuit topography areas 13 is generally oriented parallel to the major flat on the wafer.

FIG. 2 depicts an enlarged view of a section of a semiconductor wafer 20 which represents the four adjacent corners of four integrated circuit regions 21 through 24 and depicting the end result of use of the chip/mask corner information system of this invention. As shown in FIG. 2, at the bottom righthand corner of IC chip 21 (and every other chip on the wafer) is a mask sequence array 30. On the bottom lefthand corner of chip 22 (and all other chips on the wafer) is an alignment key pattern array 50. At the top lefthand corner of chip 23 (and all other chips) is a product identification area 70. At the top righthand corner of IC chip 24 (and all other chips on the wafer) is a test device area 90 which also serves in some instances as a part identification area.

The mask sequence array 30 is a two-dimensional rectangular array of mask indicia locations 31 through 46. The alignment key pattern array 50 comprises a two-dimensional rectangular array of alignment key pair locations 51 through 66. Each of the mask indicia locations 31 through 46 in the mask sequence array 30 corresponds one-for-one to a particular photomask in a photomask set. In a preferred embodiment of the mask sequence array, the individual regions of the array are marked by a geometric pattern of squares 47 which assist in indicating the array locations. The details of the use of this preferred mask sequence array are given in a copending and commonly assigned Chiang patent application entitled, "System for Specifying Critical Dimensions, Sequence Numbers, and Revision Levels on Integrated Circuit Photomasks", Ser. No. 222,254, filed Jan. 2, 1981. The disclosure of this copending application is hereby incorporated by reference and will be referred to hereafter as Chiang-I. As shown in FIG. 1 and as more specifically taught in the above-identified copending application, the mask indicia utilized in the mask sequence array 30 is preferably a critical dimension pattern 31A. In addition, each location in the mask sequence array preferably also includes a mask revision level code 31B, a portion of which may be integrated with the critical dimension pattern 31A to save space. As shown in FIG. 1, there are photomask sequence indicia located in each of the first fourteen squares of the photomask sequence array 30, indicative of the fact that fourteen masks were utilized in creating the integrated circuit on this particular wafer. Since there are no missing indicia in the first fourteen squares, the mask sequence array permits verification that no masks in the sequence were omitted. The mask sequence array also permits verification that there were no gross alignment errors in the photolithography operations on the wafer, since otherwise one of the pattern of marked squares would be offset from the other by a substantial amount.

At each of the locations 51 through 63 in the alignment key pattern array 50 there is recorded on the wafer an alignment key pair: for example 51A and 51B at location 51. In addition, each of the alignment key locations 51 through 62 there is recorded on the wafer an I-bar blot mark, such as, for example, the I-bar blot mark 51C at location 51. The alignment key pattern array 50 including the use of I-bar blot marks is a preferred system for alignment keys and is taught more specifically in a copending and commonly assigned Chiang patent application entitled, "System for Providing Photomask Alignment Keys in Semiconductor Integrated Circuit Processing", Ser. No. 222,257, filed Jan. 2, 1981. The disclosure of this copending application (hereinafter referred to as "Chiang-II") is hereby incorporated by reference. The details of use of the mask sequence array 30 and the alignment key pattern array 50 will be briefly discussed below in conjunction with FIGS. 3 through 6 which depict the actual appearance of the four corner mask information system on several photomasks in a fourteen photomask set.

The device identification area 70 on wafer 20 contains a manufacturer identification area 71 and a device identification code area 72. These items of device identification are shown for purposes of example only, and it should be understood that any type of device identification desired by the manufacturer could be recorded on the chip in this location. For example, in some instances it may be desirable to leave a space for recording a part number on the chip using some of the masks in the set as an alternative to recording a part number in the test device area 90. Another identification that may be desired in this area is a copyright notice on the chip in the event that the chip should contain a fixed ROM pattern containing program instructions which are copyrightable.

The test device area 90 shown in FIG. 2 includes both a minimum size test transistor 91 and a large test transistor 92 (which is covered in this case by metallized areas). The arrangement of this large test transistor will be apparent from a consideration of FIG. 7 to be discussed below. The large test transistor is designed to be probed prior to forming the metal interconnect structure over the wafer, whereas the small minimum size test transistor 91 is designed to be probed after the metal interconnect structure has been formed over the wafer. The photomask topography which creates these two test devices is depicted in FIGS. 7 and 8 and a cross-section through the small minimum size transistor 91 is depicted in FIG. 10 to illustrate the topographical and topological structure of a bipolar test transistor. In some semiconductor processes, it is typical to have a test chip included in the array of chips on the wafer as an alternative to forming test devices on each chip. In such a technology it may be desirable only to utilize three corner areas of each chip for designated information areas.

Designated information areas 30, 50, 70, and 90 shown in FIG. 2 may, for example, each be approximately 150 micron square. Generally each corner area will be at least about 50 microns from the nearest wafer bonding pads. These sizes relate to a particular current photolithography process technology involving basically a minimum of 2 micron align widths. As semiconductor processing is further refined to enable even smaller feature sizes to be utilized, the sizes of the designated information areas in the four corners of the chip may be reduced accordingly. Moreover, the sizes of the mask indicia array 30 and the alignment key array 50 may be reduced in some technologies which require fewer photomasks. For example, a 3×3 array may be used if nine or fewer masks are required.

Referring now to FIGS. 3 through 6, it will be briefly discussed how the chip corner information system of this invention is utilized in practice in designing photomasks and in manufacturing integrated circuits on semiconductor wafers utilizing photomasks designed in accordance with this invention. FIG. 3 depicts a section of a first photomask M1 where the four corners of adjacent circuit topography patterns 121 through 124 come together. This same four corner pattern is replicated across the photomask at other locations as depicted in FIG. 1. FIG. 4 depicts a section of a photomask M2 at the same location as the section of photomask M1 in FIG. 3. Similarly FIG. 5 depicts a corresponding section of a photomask M3 and FIG. 6 depicts a corresponding section of a photomask M14. The intervening photomasks M4 through M13 are not depicted since the general characteristics of the chip/mask corner information system of this invention are illustrated by these four photomasks. Again reference to the Chiang-I and Chiang-II copending applications incorporated herein by reference gives a more complete explanation of the mask sequence array portion of the mask design and the alignment key pattern array portion.

Referring first to the top lefthand corner section of each wafer topography pattern illustrated by the bottom righthand square in the four corner area, it can be seen that on each of the masks M1, M2, M3, and M14, the same manufacturer and device identification code is formed. As a result, during each photolithography step the image of this information is replicated on the wafer always at the same location so that the information is continually reinforced on the semiconductor wafer as it is processed through the sequential photolithography and related process steps.

Referring to the upper lefthand corner square shown in each of the FIGS. 3 through 6 (constituting the bottom righthand corner of each circuit topography pattern on each mask), it is seen that, at this location on each mask, a marked array in the form of a two-dimensional line pattern outlining a four-by-four array of mask sequence indicia locations is formed. Thus, the four-by-four marked array 147 on mask M1 is identical to the array 247 on mask M2, the array 347 on mask M3, and the array 1447 on mask M14. However, although the marked array is identical on each photomask in the sequence, the photomask sequence indicia for each photomask is positioned at a location in the array corresponding to the mask sequence number. Accordingly, mask M1 has its mask sequence indicia 131A positioned at location 1. Mask M2 in FIG. 4 has its mask sequence indicia 232 at location 2 in the array. Similarly mask M3 in FIG. 5 has its mask sequence indicia 333A located in square 3 of the array, and mask M14 in FIG. 6 has its mask sequence indicia 1440A located in square 14 of the array. As previously indicated each of these mask sequence indicia is preferably an identical critical dimension pattern. Also included in the mask sequence indicia location for each photomask is a mask revision level code such as 131B in FIG. 3. As each mask in the sequence M1 through M14 is used in sequential photolithography operations on a wafer, the marked array at this location becomes reinforced each time and, at each photolithography step, the mask sequence indicia associated with each photomask is recorded on the wafer at a corresponding mask sequence indicia location. Accordingly, referring back to FIG. 2, it is seen that after the fourteen photomasks have been all utilized during sequential photolithography operations, the first fourteen locations in the array are filled with mask sequence indicia.

Referring now to the alignment key pattern areas depicted on the set of photomasks in FIGS. 3 through 6, we will briefly discuss the preferred alignment key system although the complete details of that system are disclosed in the Chiang-II patent application incorporated herein by reference. Each of the photomasks depicted in FIGS. 3 through 6 has an alignment key pattern formed in the top right corner in the four corner area, which pattern includes one or both alignment keys and aligning keys. The aligning keys and alignment keys are formed in this area based on the mask alignment formula shown in FIG. 9. As shown in FIG. 9, mask M1 has only one subsequent photomask M2 to be aligned to it. Since M1 is the first photomask in the series, it does not have to be aligned specifically to any prior topography pattern created on the wafer. Consequently, the alignment key pattern on mask M1 in FIG. 3 consists simply of an aligning key in the form of a smaller square key 151B positioned at location 1 in the alignment key pattern array 150. This aligning key is designated 1-1, indicating that it is formed by the first photomask at location 1. Referring to FIG. 4, the alignment key pattern area 250 on photomask M2 has an alignment key pattern consisting of an alignment key designated 2/1-1 and two aligning keys designated 2-2 and 2-3. The alignment key 2/1-1 is a larger square key 251A, the aligning key 2-2 is a larger square key 252A, and the aligning key 2-3 is a smaller square key 253B. The alignment key 2/1-1 enables the mask M2 to be aligned to the aligning key at location 1 which is reproduced on the wafer by use of the first photomask M1. The two aligning keys 2-2 and 2-3 are formed on mask M2 since, as shown in the mask alignment formula of FIG. 9 both masks M3 and M4 are required to be aligned to the topography pattern created by mask M2.

Referring to mask M3 in FIG. 5, it is seen that the alignment key pattern formed thereon in area 350 consists of an alignment key 3/2-2 and two aligning keys designated 3-4 and 3-5. The alignment key 3/2-2 is a smaller square key 353B which is designed to be aligned with the aligning key formed by mask M2. The two aligning keys designated 3-4 and 3-5 are both larger keys (354A and 355A respectively) and are provided because mask M3 is designed to have both masks M5 and M6 aligned thereto. In addition, the mask alignment key pattern in area 350 on mask M3 includes an I-bar blot mark 351C formed at location 1 in the alignment key array. Accordingly, when mask M3 has been utilized, the I-bar blot mark 351C will be reproduced on the wafer at location 1 and will thus form an I-bar blot over the used alignment key pair created as a result of photolithography steps using masks M1 and M2. Generally the principles of the preferred alignment key system which is disclosed in more detail in the Chiang-II patent application involves the assignment of alignment key locations in the alignment key array for each photomask after the first at either the next alignment key location or at the same alignment key location as the previous photomask if the new alignment key is to utilize the same aligning key formed by previous photolithography operation. Each of the photomasks after the second photomask which has a new alignment key location assignment also has an I-bar blot mark on it. Accordingly, the principles of the preferred alignment key system are that the alignment key on the photomask is either the key at the lowest key location on the photomask or it is the key after the I-bar blot mark thereon. If the photomask does not have an I-bar blot mark thereon, the alignment key is aligned with the aligning key on the wafer at the next key location after the last I-bar blot mark on the wafer, if any. If the alignment key pattern on the mask includes an I-bar blot mark, then the alignment key which is at the next key location after the blot mark is aligned to an aligning key on the wafer which is two key locations after the last blot mark, if any, recorded on the wafer. As a result of the systematic assignment of aligning and alignment key locations and the use of the I-bar blot mark, the preferred alignment key system is a self-instructing system so that the photomask alignment operator can perform mask alignment without reference to extrinsic instructions. This invention is not limited to the use of this preferred alignment key system since major aspects of the benefits of this invention can be achieved using any alignment key system in the designated corner area of each topography pattern. However, the alignment key system should utilize the two-dimensional array of alignment key locations but this can accommodate a wide variety of types of alignment key systems that have been used in the prior art. The photomask set used as an example in FIGS. 3 to 6 of this application correlates with the fourteen photomask set discussed in the Chiang-II patent application so the details of the alignment key patterns on each photomask need not be repeated here.

Consider now the manner in which the mask/chip corner information system of this invention is utilized by the photomask alignment operator during the process of a photomask alignment. For purposes of illustration, assume that the first photolithography operation using mask M1 in FIG. 3 has already been performed. After the performance of this photolithography operation and the related process steps, the wafer topography pattern in the four corner area will generally correspond to that of the mask topography pattern shown in FIG. 3. For the next photolithography operation, the task is to the align the mask M2 with the topography created by the mask M1. The mask alignment operator selects the mask M2 from the mask set corresponding to the device JB2T001 and places the photomask in its appropriate location in the mask alignment apparatus. Since mask M2 is a dark field mask, the operator will utilize the light field areas corresponding to the mask sequence array 230 and the device identification area 270 to align the patterns of these areas to the pattern created previously on the wafer. This rough alignment operation is performed with the operator viewing all four of the corner areas simultaneously. Once the rough alignment has been completed the operator can see that a photomask from the correct mask set was selected since the device identification on the photomask matches that recorded previously on the wafer. In addition, the operator can verify that the proper photomask in the sequence was selected since the operator can see that the photomask sequence indicia on the mask is at location 2 in the mask sequence array and the recorded indicia on the wafer is at location 1 in the array. (Consider if the operator had mistakenly selected mask M3. The second location in the mask sequence array would be blank and the operator would realize the wrong mask was selected.) Having performed this rough alignment and verified proper mask selection, the operator can then go to the alignment key 2/1-1 and, by focusing the alignment microscope in on the alignment key area, can quickly align the alignment key on mask M2 to the aligning key previously formed on the wafer.

After the photolithography operation has been performed, the quality control people can readily monitor the quality of that operation using the critical dimension pattern recorded on the wafer by the critical dimension pattern 232A on mask M2. The quality control personnel can readily see directly on the wafer that the critical dimension pattern at location 2 is the one to be used for this measurement since they can tell from the location of the last mask sequence indicia that that is the appropriate critical dimension to measure. The quality control personnel do not have to search all over the wafer for the critical dimension pattern since it is always in the bottom righthand corner area of each chip area on the wafer in the mask sequence array.

It can thus be seen that the mask/chip corner information system of this invention is particularly useful for dark field photomasks since not only does the mask alignment operator not have to search throughout the mask for the mask sequence indicia but the marked array of mask sequence locations permits a rough alignment of the photomask to the wafer using a light field area so that the alignment key on the mask will be roughly positioned with respect to the aligning key on the wafer. Consequently, ultimate fine alignment can readily be achieved without the operator having to attempt to search the wafer for the aligning key using only the open area in the alignment key pattern on the mask. It should also be apparent that the mask/chip corner information system of this invention readily enables the mask alignment operator to ascertain that orientation of the photomask with respect to the topography pattern on the wafer is correct since otherwise the corner areas on the mask will not be oriented in the same way as the corner areas on the wafer.

FIGS. 3 through 6 show some of the topography patterns in the bottom left corner area utilized to form the topography and topology of a pair of bipolar transistor test devices. FIGS. 7 and 8 illustrate in a superposed fashion the topography of the various masks in a fourteen mask sequence for creating the two bipolar test transistors. Referring to FIG. 3 in connection with FIGS. 7 and 9, it is seen that the photomask M1 has two rectangular regions 190-1A and 190-2A thereon which are used to define the locations of buried layer regions in the wafer. The buried layer region 190-1B in wafer 26 in FIG. 10 corresponds to the location of the rectangular area 190-1A on photomask M1.

The mask M2 shown in FIG. 4 and FIG. 7 has a region 290-1A thereon which is used to define the P-doped isolation wells 290-1B shown in FIG. 10. These P-doped isolation wells extend through the epitaxial layer 27 which is grown on wafer 26 after the buried layer region 190-1B is formed therein.

Mask M3 shown in FIGS. 5 and 7 is utilized to define the collector areas 390-1A and 390-2A of the two bipolar test transistors. The collector area shown in FIG. 10 is identified as 390-1B and is a heavily N-doped region extending through the epitaxial layer 27 to contact the buried layer region 190-1B. Mask M4 is utilized in connection with mask M3 in a double layer photoresist process which is explained in the copending Chiang-II patent application. The topography of mask M4 is substantially the same as the topography of mask M3 and together they define the collector region 390-1B in FIG. 10. The double layer photoresist process is used to eliminate photoresist pinhole problems in the photoresist layer directly on the wafer during later wafer fabrication operations.

Mask M5 shown in FIG. 7 defines the base regions 590-1A and 590-2A for the two test transistors. The base region for the smaller test transistor is identified in FIG. 10 as 590-1B and is a P-doped region.

Mask M6 shown in FIG. 7 is generally used to create resistors in other areas of the wafer, but is also used to create a base contact region identified as 690-1A in FIG. 7 and 690-1B in FIG. 10. This is a P-doped region which assists in forming a good ohmic contact to the base region 590-1B.

Masks M7 and M8 together create the emitter region in both test transistor devices identified as regions 790-1A and 790-3A in FIG. 7. The emitter region for the small transistor device is identified in FIG. 10 as 790-1B and is an N-doped region. This same photomask creates collector contact regions 790-2A and 790-4A as shown in FIG. 7. This collector contact area is designated 790-2B in FIG. 10.

Mask M9 is a preohmic mask and simply opens the contact areas identified as 990-1A and 990-2A in FIG. 8. In FIG. 10 the contact opening to the base contact region 690-1B is identified as the aperture 990-1B existing in the insulating layer 28A. The contact openings to the emitter region 790-1B and the collector contact region 790-2B were formed and maintained during the prior photolithography step using mask M7. Mask M10 is a contact protect mask which is utilized with mask M9 and has substantially the same topography. After the photolithography and related processing using masks M9 and M10 have been completed, the large test transistor is formed and is available for probing. For probe testing, metal pins are brought down onto the wafer to contact the base, emitter and collector contact areas so that transistor characteristics can be measured.

Mask M11 is the first metal mask and is utilized to define the collector, emitter and base contact pads identified as 1190-1A, 1190-2A, and 1190-3A in FIG. 8. Corresponding metal contact regions are identified as 1190-1B, 1190-2B, and 1190-3B in FIG. 10. As shown in FIG. 8, the emitter contact region 1190-2A spans the collector, emitter, and base contact regions of the large test transistor and thus shorts the large test transistor to eliminate the possibility of a floating device on the chip. In addition, it will be seen that the first metal mask defines a first part number topography pattern "169". This part number identification may be utilized in conjunction with a master/slice circuit approach in which a basic arrangement of transistors is formed in each chip area on the wafer with the interconnection of these transistors being defined by the metal interconnect layers and being different for different part numbers. Accordingly, the part number 169 identifies a particular metal interconnect pattern for a particular part number as part of the master/slice system.

The mask M12 shown in FIG. 8 creates windows or vias through the second insulating layer 28B which is formed over the first metal layer after it has been patterned using mask M11. Mask M12 opens a via designated 1290-1A for the collector contact pad, a via designated 1290-2A for the base contact pad and a via designated 1290-3A for the emitter contact pad. In addition, via areas 1290-4A and 1290-5A shown in FIG. 8 form a second part number identification pattern in the second insulator layer 28B. Accordingly, when the mask alignment operator is utilizing mask M11 she can readily check to see that she has a mask corresponding to the same part number as recorded in the first metal layer. The corresponding vias are designated as 1290-1B and 1290-2B in FIG. 10 for the collector and base vias, respectively. The via for the emitter contact is not in this section plane and is thus not represented in FIG. 10.

Mask M13 is the second metal mask and patterns a second layer of metal formed over the second insulating layer 28B shown in FIG. 10. The second metal mask creates test pad areas 1390-1A and 1390-2A and 1390-3A for the collector base and emitter contacts, respectively as shown in FIG. 8. In addition, a third part number identification pattern is formed in a section designated 1390-4A so that verification of the proper M13 mask to create the part number 169 can be performed during mask alignment.

The M14 mask is a bonding pad and scribe line mask which is depicted in FIG. 6 and is utilized to open windows to the test pad areas through the test pad areas for the small transistor through the passivation layer 28C shown in FIG. 10.

It should be understood that the topography patterns on these respective masks in the other regions of the chip topography pattern areas on each wafer is designed according to the circuitry desired on each chip and is a standard well-known process for circuit designers and mask layout designers. The mask/chip corner information system of this invention is independent of the circuit patterns formed in each chip area of the mask.

The mask/chip corner information system of this invention has been described above in connection with examples of preferred embodiments and in connection with an example of a fourteen photomask set for manufacturing integrated circuit devices using a particular bipolar process technology. It should be understood that numerous modifications could be made to the preferred embodiments without departing from the scope of this invention. It should further be understood that the invention is equally applicable to other types of bipolar processes involving different numbers of masks in the mask set, different mask alignment formulae, and different transistor topology and topography. It is also applicable to other types of semiconductor process technologies such as conductor-insulator-semiconductor field effect transistor technologies.

What is claimed is:

1. In a method for providing mask sequence and mask alignment information on a set of photomasks designed to be used in processing semiconductor wafers into integrated circuits wherein said photomasks are to be used in a prearranged sequence during sequential photolithography steps and a topography pattern on each photomask except the first is required to be aligned to the wafer topography pattern created by use of at least one prior photomask in accordance with a predetermined mask alignment formula, the steps of:

selecting prior to photomask design and generation a plurality of common corner subareas of each circuit topography pattern area on each photomask to be used as designated information locations, one of said designated information locations being adapted to contain a two-dimensional rectangular array of locations for use as a mask sequence array and another of said designated information locations being adapted to contain a two-dimensional rectangular array of locations for use as an alignment key pattern array;

forming in each said mask sequence array on each photomask a mask sequence indicia positioned in a unique one of said mask sequence array locations; and forming in said alignment key pattern array on each photomask an alignment key pattern in the form of one or both of alignment and aligning keys positioned in prearranged ones of said key locations.

2. The method of claim 1, wherein another one of said designated information locations is adapted to serve as a device identification area, and further comprising the step of forming in said device identification area on each photomask an identical indicia of one or both of the device manufacturer and device identification code.

3. The method of any of claims 1 or 2, wherein another of said design information locations is selected to serve as a test device area, and further comprising the step of forming in said test device area on successive photomasks the topography pattern required for forming said test devices during sequential photolithography steps and related wafer processing operations.

4. The method of claim 3, adapted for use with a semiconductor process which employs two layer metal interconnect and the topography pattern for the photomasks associated with patterning the first and second metal layers in the intervening insulating layer each having a part number identification pattern formed therein at a preselected unique location so that three replicated part number identification patterns will be produced at separate locations within the test device areas on completely processed wafers.

5. The method of claim 1, wherein said step of forming said mask sequence indicia includes forming a light field mask coding pattern comprising a prearranged marked two-dimensional array of geometric areas together with a preselected indicia located in a prearranged one of said geometric areas indicating the particular photomask sequence number associated with each of said photomasks, thereby enabling said mask coding pattern to be used as a mask orientation and coarse alignment aid during the mask alignment step of wafer processing using said set of photomasks.

6. The method of claim 1, wherein said alignment key pattern area comprises a two-dimensional array of sequential key locations, and said step of forming said alignment key pattern comprises the steps of:
designating for each photomask after the first one an alignment key location which is either the same alignment key location as the immediately preceding photomask or the next alignment key location in said array;
forming on the first photomask of said set a mask key pattern comprising aligning keys for all associated higher number photomasks designed in accordance with said mask alignment formula to be aligned to the topography created by use of said first photomask, each of said aligning keys being formed at key locations corresponding to said designated alignment key location for said associated photomask;
forming on each of the remaining photomasks of said set a mask key pattern comprising an alignment key at said designated alignment key location and aligning keys for any associated higher number ones of said photomasks designed in accordance with said mask alignment formula to be aligned to topography created by use of each said photomask, each of said aligning keys being formed at a key location corresponding to said designated key location for said associated photomask; and
forming on each photomask having a mask sequence number greater than two and being the first photomask in said set to have a particular designated alignment key location, a used key pair blot mark at a key location immediately preceding said designated alignment key location for said mask.

7. In a process for the design and manufacture of integrated circuit chips, the steps of:

designing each of a plurality of photomasks required to be utilized in sequence for performing photolithography operations in conjunction with a particular semiconductor integrated circuit fabrication process while leaving a plurality of common corner subareas of each circuit topography pattern area on each photomask free of circuit topography and interconnect patterns to be used as designated information locations, one of said designated information locations being adapted to contain a two-dimensional rectangular array of locations for use as a mask sequence array and another of said designated information locations being adapted to contain a two-dimensional rectangular array of locations for use as an alignment key pattern array;
forming in each said mask sequence array on each photomask a mask sequence indicia positioned in a unique one of said mask sequence array locations;
forming in said alignment key pattern array on each photomask an alignment key pattern in the form of one or both of alignment and aligning keys positioned in prearranged ones of said key locations;
performing on a semiconductor wafer a prearranged sequence of processing steps including a prearranged sequence of photolithography processing steps each using one of said photomasks in sequence and including for each of said photolithography processing steps after the first a step of aligning the topography pattern on an associated one of said photomasks to the wafer topography pattern produced as a result of prior photolithography processing steps, said alignment step including checking the proper sequencing of photomask use and proper photomask orientation using said preselected indicia location in said array mask sequence together with a replicated indicia produced on the wafer as a result of prior photolithography processing steps and aligning said photomask to the wafer by aligning a preselected alignment key on said photomask to a prearranged aligning key produced on said wafer as a result of prior photolithography processing steps.

8. The method of claim 7, wherein another one of said designated information locations is selected to serve as a product indentification area, and further comprising the step of forming in said product identification area on each photomask an identical indicia of the product manufacturer and a product identification code, said alignment step further including checking the use of a photomask from the appropriate mask set by comparing said product identification code on said mask to the product identification code replicated on said wafer as a result of prior photolithography steps.

9. The method of any of claims 7 or 8, wherein another of said designated information locations is selected to serve as a test device area, and further comprising the steps of forming in said test device area on successive photomasks the topography pattern required for forming said test devices during sequential photolithography steps and related wafer processing operations.

10. The method of claim 9, adapted for use with a semiconductor process which employs a two-layer metal interconnect and the topography pattern for the photomask associated with patterning the first and second metal layers and the intervening insulating layer each having a part number identification pattern formed therein at preselected different locations so that three replicated part number identification patterns will be produced at separate locations within the test device areas on said wafer after said sequential wafer processing steps have been performed.

11. The method of claim 7, wherein said step of forming said mask sequence indicia includes forming a light field mask coding pattern comprising a prearranged marked two-dimensional array of geometric areas together with a preselected indicia located in a prearranged one of said geometric areas indicating the particular photomask sequence number associated with each of said photomasks; said alignment key pattern area comprises a two-dimensional array of sequential key locations; said step of forming said alignment key pattern comprises the steps of:

designating for each photomask after the first one an alignment key location which is either the same location as the immediately preceding photomask or the next location in said array of sequential key locations;

forming on the first photomask of said set at the time of photomask generation a mask key pattern comprising aligning keys for all associated ones of said photomasks designed to be aligned to the topography pattern created by use of said first photomask, each of said aligning keys being formed at said designated alignment key location for said associated aligned photomask;

forming on each of the remaining photomasks of said set a mask key pattern comprising an alignment key at said designated alignment key location together with aligning keys for any associated higher number ones of said photomasks designed to be aligned to topography created by use of said photomask, each of said aligning keys being formed at said designated alignment key location of said associated aligned photomask; and forming on each photomask having a mask sequence number greater than two and being the first in said set to have a particular designated alignment key location a used key pair blot mark at a key location immediately preceding said designated alignment key location for said mask; and said step of aligning said photomask to the existing circuit topography on said wafer comprises the step of aligning said alignment key on said photomask at said designated key location to the aligning key reproduced on said wafer at said designated key location as a result of prior photolithography process steps using an associated lower number photomask and utilizing used key pair blot marks, if any, reproduced on said wafer as a result of prior photolithography process steps together with a used key pair blot mark, if any, formed on said mask as self-instructing mask alignment guides so that said step of aligning each of said photomasks having a blot mark thereon is facilitated by aligning the alignment key after the blot mark on the mask to the aligning key on the wafer located two key locations after the last blot mark, if any, previously created on said wafer, and said step of aligning each photomask having no blot mark thereon is facilitated by aligning the alignment key on the mask to the aligning key on said wafer located one key location after the last blot mark, if any, previously created on the wafer.

12. The method of claim 11, wherein some of said photomasks in said set are dark field masks having dark field alignment key patterns in said alignment key pattern array, and said step of aligning each of said dark field photomasks includes the steps of first coarsely aligning the photomask to the existing circuit topography pattern on said wafer by aligning said light field mask coding pattern on said mask with the mask coding pattern produced on said wafer as a result of prior photolithography processing steps and then finely aligning the photomask to the existing circuit topography on said wafer by aligning said alignment key on said photomask at said designated key location to the aligning key produced on said wafer at said designated alignment key location as a result of a photolithography processing step using an associated lower number photomask.

13. In a set of photomasks adapted to be used during sequential photolithography processing steps in an overall process for manufacturing integrated circuit chips on a semiconductor wafer, a plurality of designated information locations formed in a plurality of common corner subareas of each circuit topography pattern area on each mask in said set, one of said design information locations being adapted to contain a two-dimensional rectangular array of locations for use as a mask sequence array and another of said designated information locations being adapted to contain a second rectangular array of locations for use as an alignment key pattern array; each of said photomasks having a mask sequence indicia positioned in a unique one of said mask sequence array locations and having an alignment key pattern formed in said alignment key pattern array in the form of one or both of alignment and aligning keys positioned in prearranged ones of said key locations.

14. The photomask set of claim 13, wherein another one of said designated information locations is selected to serve as a product identification area and each photomask in said set includes an identical indicia of one or both of the device manufacturer and a product identification code located in said product identification area thereon.

15. The photomask set of any of claims 13 or 14, wherein another of said designated information locations is selected to serve as a test device area, and each of the successive photomask in said set includes a topography pattern in said test device area adapted to form preselected test devices during sequential photolithography steps and related wafer processing operations using said set of photomasks.

16. The photomask set of claim 15, adapted for use in conjunction with a semiconductor process which employs a two-layer metal interconnect, wherein the topography pattern for the photomasks associated with patterning the first and second metal layers and the intervening insulating layer each includes a part number identification pattern formed in said test device area at a preselected different location such that three replicated part number identification patterns will be produced at separate locations within the corresponding test device areas on wafers processed using said set of photomasks.

17. The photomask set of claim 13, wherein said mask sequence indicia comprises a light field mask coding pattern including a prearranged marked two-dimensional array of geometric areas together with a preselected indicia located in a prearranged one of said geometric areas indicating the particular photomask sequence number associated with each of said photomasks, said mask sequence indicia thereby enabling said mask coding pattern to be used as a mask orientation and coarse alignment aid during the mask alignment step of wafer processing with said set of photomasks.

18. The photomask set of claim 13, wherein said alignment key pattern area comprises a two-dimensional array of sequential key locations, each of said photomasks after the first one having a designated alignment key location which is either the same location as the immediately preceding photomask in the sequence or the next location in said array, said mask key pattern on the first photomask of said set comprising aligning keys for all associated higher number photomasks designed to be aligned to the topography pattern created by use of said first photomask, each of said aligning keys being formed at a key location corresponding to said designated key location for said associated aligned photomask, said mask key pattern on each of the remaining photomasks comprising an alignment key at a key location corresponding to said designated key location together with aligning keys for any associated higher number ones of said photomasks designed to be aligned to topography created by use of each said photomask, each of said aligning keys being formed at a key location corresponding to said designated key location for said associated aligned photomark, each of said photomasks having a mask sequence number greater than two and being the first in said set to have a particular designated alignment key location also having a used key pair blot mark formed thereon at a key location immediately preceding said designated alignment key location for said mask.

19. A semiconductor wafer having formed thereon a plurality of replicated partial or completed integrated circuit structures, each of said integrated circuit structures having a plurality of corner subareas free of functioning circuit structures and circuit interconnect structures, one of said corner subareas having a photomask sequence coding pattern thereat in the form of a two-dimensional rectangular array of preselected indicia, including a critical dimension pattern, positioned in locations of said array corresponding to mask sequence numbers of photomasks used to create said IC structures and another of said corner subareas having a two-dimensional rectangular array of used alignment key pairs thereat, said used alignment key pairs being positioned in predetermined key locations in said array corresponding to assigned alignment key locations for said photomasks used to create said integrated circuit structures.

* * * * *